United States Patent
Robinson

(10) Patent No.: US 10,503,203 B2
(45) Date of Patent: Dec. 10, 2019

(54) LOW-POWER MULTI-PHASE CLOCK DISTRIBUTION ON SILICON

(71) Applicant: Dirk J. Robinson, Fort Collins, CO (US)

(72) Inventor: Dirk J. Robinson, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 85 days.

(21) Appl. No.: 15/838,683

(22) Filed: Dec. 12, 2017

(65) Prior Publication Data

US 2019/0179362 A1 Jun. 13, 2019

(51) Int. Cl.
*G06F 1/10* (2006.01)
*H03K 19/096* (2006.01)

(52) U.S. Cl.
CPC .............. *G06F 1/10* (2013.01); *H03K 19/096* (2013.01)

(58) Field of Classification Search
CPC ............ G06F 1/04; G06F 1/10; H03K 19/096
USPC ......................................................... 327/163
See application file for complete search history.

(56) References Cited

U.S. PATENT DOCUMENTS

| | | | | |
|---|---|---|---|---|
| 5,043,596 A | * | 8/1991 | Masuda | G06F 1/06 327/115 |
| 5,309,015 A | * | 5/1994 | Kuwata | G06F 1/10 257/207 |
| 5,712,585 A | * | 1/1998 | Jeong | H03K 19/01859 174/36 |

OTHER PUBLICATIONS

Agilent Technologies; *De-emphasized Signal Generation with the Agilent N4916A De-Emphasis Signal Converter*—Application Note; http://application-notes.digchip.com/018/18-27236.pdf; Feb. 7, 2008; pp. 1-20.
Ransom Stephens; Agilent Technologies; *Equalization: The Correction and Analysis of Degraded Signals*—White Paper; http://cp.literature.agilent.com/litweb/pdf/5989-3777EN.pdf; Aug. 15, 2005; pp. 1-12.
Agilent Technologies; *Agilent De-emphasized Signal Generation with the Agilent 81250A ParBERT*—Application Note; http://cp.literature.agilent.com/litweb/pdf/5990-4053EN.pdf; Oct. 1, 2009; pp. 1-20.
Wikipedia; *Differential Signaling*; https://en.wikipedia.org/wiki/Differential_signaling; Nov. 5, 2016; pp. 1-4.
Wikipedia; *Differential TTL*; https://en.wikipedia.org/wiki/Differential_TTL; Mar. 8, 2010, p. 1.
Barry Olney; In-Circuit Design Pty Ltd, Australia; *Differential Pair Routing*; http://www.icd.com.au/articles/Differential_Pair_Routing_PCB-Oct2011.pdf; The PCB Magazine; Oct. 2011; pp. 48-52.

(Continued)

*Primary Examiner* — William Hernandez
(74) *Attorney, Agent, or Firm* — Timothy M. Honeycutt

(57) ABSTRACT

Various semiconductor chip clock signal pathways are disclosed. In one aspect, a semiconductor chip with a receiver includes a clock signals pathway for conveying plural clock phases in the receiver. The clock signals pathway includes plural wires in an arrangement that has a first edge, a second edge separated from the first edge and a midline between the first edge and the second edge. Each of the wires conveys a clock phase. The wires of the arrangement are routed so that, along a length of the clock signals pathway, each of the wires spends about the same percentage of time at or nearer the first edge or the second edge and at or nearer the midline.

20 Claims, 4 Drawing Sheets

(56) References Cited

OTHER PUBLICATIONS

Eclips; *Embedded Cooling Layer—Interactive Power System*; https://www.cirexx.com/eclips/; 2016; pp. 1-4.

www.reseachgate.net; *Fig. 7 Cross section via the LLRF hardware motherboard with layer*; https://www.researchgate.net/figure/234052943_fig6_Fig-7-Cross-section-via-the-LLRF-hardware-motherboard-with-layer-description-and; Nov. 2, 2016; pp. 1-8.

Wikipedia; *Low-voltage differential signaling*; https://en.wikipedia.org/wiki/Low-voltage_differential_signaling; Oct. 12, 2016; pp. 1-6.

Wikipedia; *Microstrip*; https://en.wikipedia.org/wiki/Microstrip; May 21, 2016; pp. 1-4.

Wikipedia; *Stripline*; https://en.wikipedia.org/wiki/Stripline; Nov. 7, 2016; pp. 1-2.

Wikipedia; *Via fence*; https://en.wikipedia.org/wiki/Via_fence; Mar. 9, 2016; pp. 1-4.

\* cited by examiner

US 10,503,203 B2

LOW-POWER MULTI-PHASE CLOCK DISTRIBUTION ON SILICON

BACKGROUND OF THE INVENTION

Modern microprocessors and graphics processors consume dynamic power by performing computations and by moving data. The movement of data involves driving on-chip interconnects, which are typically relatively long wires combined with repeaters to linearize wire delay. Interconnect power consumption is also due to the capacitive effects of voltage transitions on neighboring wires. As processors scale upward in size, interconnect lengths trend upward as well.

Data is sent from on-die transmitters to on-die receivers by way of the on-chip interconnects. Attendant clock signals are sent in parallel with the data, particularly for high speed serial pathways. Conventional receivers use the clock signals to phase adjust, as necessary, and synchronize the plural incoming data streams. In some conventional designs, multiple clock phases are transmitted. These often exhibit capacitive loading and resulting delays and power consumption.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
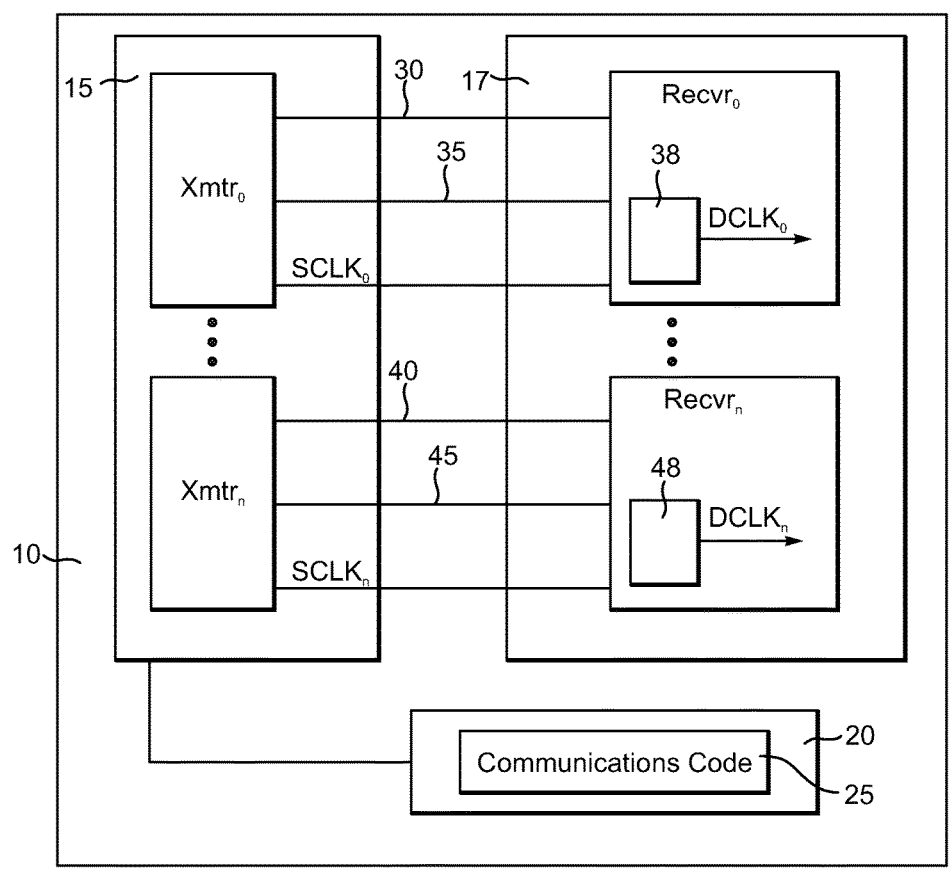
FIG. 1 is block diagram of an exemplary arrangement of a computing device.

In high-speed serialized communication, phase adjustment of data receivers and transmitters is required. To implement this, it is useful to distribute many phases of a clock signal together. Multi-phase clock routes are not typically arranged in order, as in phase 0° adjacent to phase 45° adjacent to phase 90° and so on, because phases placed on the outside will not see equal loading or transmission line characteristics compared to those placed on the inside, which causes unequal delays. Disclosed herein are arrangements that place adjacent clock phases next to each other, thereby reducing the equivalent capacitance of the multi-phase clock pathway. A lower equivalent capacitance translates into lower amounts of energy required to charge/discharge the clock transmission lines. These arrangements also eliminate the need for intermediate ground guard lines, which provide reductions in not only power consumption but also the chip area otherwise needed for the ground guards.

In accordance with one aspect of the present invention, a semiconductor chip that has a transmitter and a receiver includes a clock signals pathway for conveying plural clock phases from the transmitter to the receiver. The clock signals pathway includes plural wires in an arrangement that has a first edge, a second edge separated from the first edge and a midline between the first edge and the second edge. Each of the wires conveys a clock phase. The wires of the arrangement are routed so that, along a length of the clock signals pathway, each of the wires spends about the same percentage of time at or nearer the first edge or the second edge and at or nearer the midline.

In accordance with another aspect of the present invention, a semiconductor chip that has a transmitter and a receiver includes a clock signals pathway for conveying plural clock phases and plural dummy clock phases from the transmitter to the receiver. The clock signals pathway includes plural wires in an arrangement that has a first side and a second side. Each of the wires conveys a clock phase or a dummy clock phase. A first group of the wires carries the plural clock phases in order, and a second group of the wires carries the plural dummy clock phases. The second group of wires brackets the first group of wires.

In accordance with another aspect of the present invention, a method of manufacturing a semiconductor chip that has a receiver includes fabricating a clock signals pathway for conveying plural clock phases in the receiver. The clock signals pathway includes plural wires in an arrangement that has a first edge, a second edge separated from the first edge and a midline between the first edge and the second edge. a middle region and an outside region. Each of the wires conveys a clock phase. The wires of the arrangement are routed so that, along a length of the clock signals pathway, each of the wires spends about the same percentage of time at or nearer the first edge or the second edge and at or nearer the midline.

In accordance with another aspect of the present invention, a method of manufacturing a semiconductor chip that has a transmitter and a receiver includes fabricating a clock signals pathway for conveying plural clock phases and plural dummy clock phases from the transmitter to the receiver. The clock signals pathway includes plural wires in an arrangement that has a first side and a second side. Each of the wires conveys a clock phase or a dummy clock phase. A first group of the wires carries the plural clock phases in order, and a second group of the wires carries the plural dummy clock phases. The second group of wires brackets the first group of wires.

In the drawings described below, reference numerals are generally repeated where identical elements appear in more than one figure. Turning now to the drawings, and in particular to FIG. 1 which is a block diagram of an exemplary arrangement of a computing device 10. The computing device 10 can be any of a huge variety of different electronic devices such as a notebook computer, a tablet computer, a smart phone, a general purpose computer, a game console, a digital television, a handheld mobile device, a server, a memory device, an add-in board such as a graphics card, or any other computing device employing intra-chip communications. The computing device 10 can include one or more components such as the semiconductor chips 15 and 17 and a storage device 20. The semiconductor chips 15 and 17 can be a microprocessor, a graphics processing unit, an accelerated processing unit that combines aspects of both, a memory device, an application integrated specific circuit or other. The storage device 20 can be a non-volatile computer readable medium and can be any kind of hard disk, optical storage disk, solid state storage device, ROM, RAM or virtually any other system for storing computer readable media. The storage device 20 is operable to store nontransient computer readable instructions for performing various functions disclosed herein. Among other things, the storage device 20 can contain various types of programming code, one example of which is Communications Code 25 that facilitates the communications between various internal components of the semiconductor chip 15. The Communications Code 25 can perform or aid in performing the energy efficient clock distribution techniques described herein.

To facilitate inter-chip communications, the semiconductor chip 15 includes plural transmitters $Xmtr_0 \ldots Xmtr_n$ and the semiconductor chip 17 includes plural receivers $Recvr_0 \ldots Recvr_n$. It should be understood that the number of transmitters $Xmtr_0 \ldots Xmtr_n$ and receivers $Recvr_0 \ldots Recvr_n$ can be quite numerous and indeed number into the thousands or more depending upon the complexity of the semiconductor chip 15. Furthermore, the semiconductor chip 15 also includes one or more receivers and the semiconductor chip includes one or more transmitters, which are not depicted for simplicity of illustration. A given transmitter, such as transmitter $Xmtr_0$, is an arrangement of logic to transmit digital signals using discrete logic levels. A given receiver, such as receiver $Recvr_0$, is an arrangement of logic to receive digital signals using discrete logic levels. It should be understood that the transmitters $Xmtr_0 \ldots Xmtr_n$ can be physically or logically associated with various components of the semiconductor chip 15 and used wherever there is a requirement to transfer data from one location to another and vice versa. It should be understood that the receivers $Recvr_0 \ldots Recvr_n$ can be physically or logically associated with various components of the semiconductor chip 17 and used wherever there is a requirement to transfer data from one location to another and vice versa. A given transmitter, such as transmitter $Xmtr_0$, is connected to a given receiver, such as receiver $Recvr_0$, by way of multiple wires. In this illustrated arrangement, and for simplicity of illustration, only two wires 30 and 35 are depicted. The wires 30 and 35 can be part of a bus or other type of interconnect structure. Of course, it should be understood that there may be many more than two wires 30 and 35. There is a clock pathway $SCLK_0$ between the transmitter $Xmtr_0$ and the receiver $Recvr_0$. Typically, a single clock phase (thus the letter "S" in $SCLK_0$) is delivered on the clock pathway $SCLK_0$. The receiver $Recvr_0$ includes multi-phase clock distribution circuit 38, which is operable to convert the single clock phase $SCLK_0$ into multiple clock phases on a distributed clock pathway $DCLK_0$ (thus the letter "D" in $DCLK_0$). The multi-phase clock distribution circuit 38 can be based on a phase-locked loop or similar device. As described in more detail below, the distributed clock pathway $DCLK_0$ is configured to provide multiple clock phases that can be used by the receiver $Recvr_0$ to phase adjust data received on the wires 30 and 35. The clock pathway $DCLK_0$ is configured to convey on multiple wires multiple clock signals of different phases in such a way to balance the capacitive loading that is associated with plural closely spaced conductors conveying currents. The transmitter $Xmtr_n$ is similarly electronically connected to the receiver $Recvr_n$ by way of other wires 40 and 45, which can number more than two, and a single phase clock pathway $SCLK_n$. Like the receiver $Recvr_0$, the receiver $Recvr_n$ includes a multi-phase clock distribution circuit 48, which is operable to convert the single clock phase $SCLK_n$ into multiple clock phases on a distributed clock pathway $DCLK_n$. The skilled artisan will appreciate that each of the transmitters $Xmtr_0 \ldots Xmtr_n$ transmitter can drive signals on more than the two wires 30 and 35 and 40 and 45, respectively, and even be tied to other clock pathways (not shown). It should also be understood that the techniques described herein can be applied to intra-chip transmitter-receiver distributed clocking as well as inter-chip communications, and that the distributed clock pathways described herein can be applied to the transmitter side as well.

Before turning to a description of some exemplary arrangements for the clock pathways $DCLK_0$ to $DCLK_n$, it will be useful to briefly consider the structure and function of an exemplary conventional multi-phase clock pathway. In this regard, attention is now turned to FIG. 2, which is a schematic of an exemplary conventional clock pathway 50 that includes four wires 55, 60, 65 and 70 for conveying, from bottom to top, clock phase signals CLK 0°, CLK 180°, CLK 90° and CLK 270°, respectively. To address the issue of capacitive coupling between adjacent conductors, such as between the wire 55 and wire 60, which are in this example 180° out of phase, each of the clock phase wires 55, 60, 65 and 70 is nested between adjacent ground wires 72, 74, 76, 78 and 79. One draw back associated with having to utilize so many ground wires 72, 74, 76, 78 and 79 nested in and around the clock phase wires 55, 60, 65 and 70 is simply the amount of chip real estate that is occupied by so many additional wires. In addition there is a power of consumption penalty associated with so many extra conductors.

Figure 3:
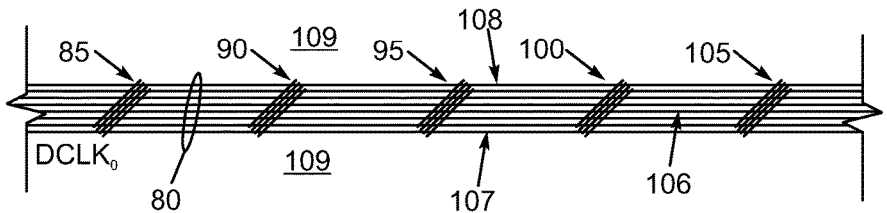
FIG. 3 is a schematic depiction of an exemplary arrangement of a multi-phase clock pathway including multiple capacitive load balancing crossovers.

An exemplary arrangement for the distributed clock pathway $DCLK_0$ depicted in FIG. 1 may be understood by referring now also to FIG. 3. FIG. 3 depicts a schematic view of a small segment of the clock pathway $DCLK_0$. The following description of the clock pathway $DCLK_0$ will be illustrative of the other clock pathways, for example, the clock pathway $DCLK_n$, as well. As shown in FIG. 3, the clock pathway $DCLK_0$ includes in this illustrative arrangement, eight conductor wires or traces 80 for conveying in the receiver $RECVR_0$ eight different clock phases. The grouping of conductor wires 80 has a opposing edges 106 and 107 and a midline between the opposing edges 106 and 107. The edges 106 and 107 adjoin an outside region 109. The wires 80 are routed so that, along the length of the clock pathway $DCLK_0$, each of the wires 80 spends about the same percentage of time at or nearer the edges 106 or 107 as it spends at or nearer the midline 108. To provide such regular rotations of the positions of the wires 80 relative to the outside region 109, i.e. the first edge 106 or the second edge 107, and the midline 108, at somewhat regular intervals along the segment of the clock pathway $DCLK_0$, the conductor wires 80 include longitudinally spaced crossovers 85, 90, 95, 100 and 105. Five crossovers 85, 90, 95, 100 and 105 are depicted but it should be understood that there may be many, many more depending upon the length of the clock pathway $DCLK_0$. At the first crossover 85, one or more of the wires 80 is rotated (i.e., routed) from a position nearer or at one of the edges 106 or 107 to a position nearer the other of the edges 106 or 107. Downstream from the crossover 85 the rotated wires 80 are progressively routed back toward the midline 108. At the next crossover 90, one or more of the wires 80 that did not crossover at the first crossover 85 is rotated (i.e., routed) from a position nearer or at one of the edges 106 or 107 to a position nearer the other of the edges 107 or 108, and then downstream of the crossover 90 the rotated wires 80 are progressively routed back toward the midline 108, and so on for the remaining crossovers 95, 100 and 105. As described in more detail below, the wires 80 and crossovers 85, 90, 95, 100 and 105 are fabricated in two conductor levels where the crossovers 85, 90, 95, 100 and 105 enable the rotation of various clock phases from at or nearer the outside region 109 to or nearer to the midline 108 of the clock pathway DCLK$_0$ (and back again repeatedly) and in doing so swap the positions of the wires conveying the individual clock phases.

Figure 4:
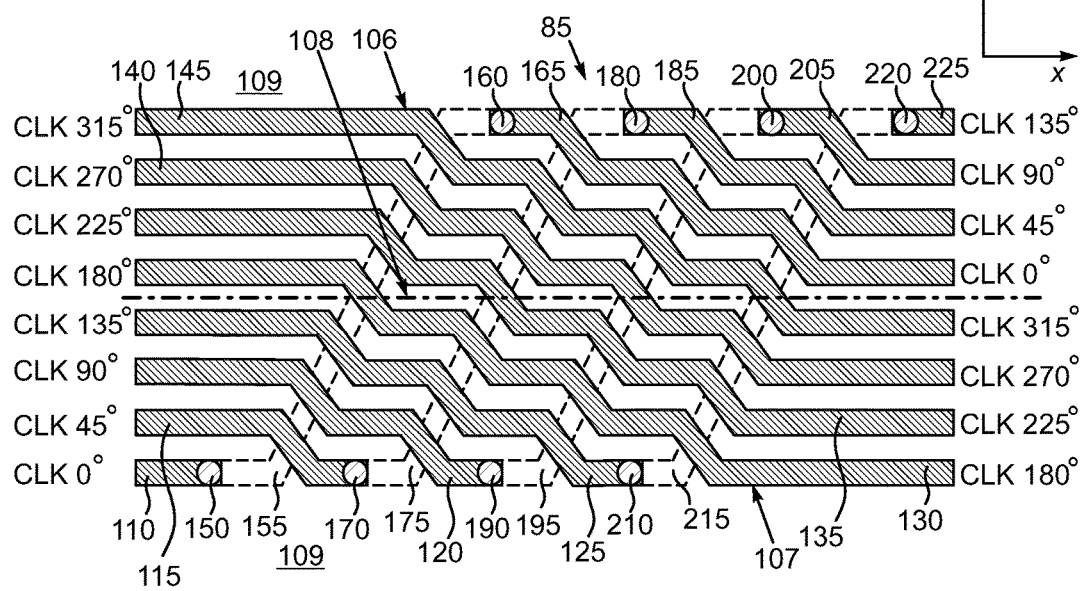
FIG. 4 is a sectional view of an exemplary arrangement of one of the crossovers of FIG. 3.

Additional details of the crossover 85 can be understood by referring now also to FIG. 4 which is a sectional view of the clock pathway DCLK$_0$ that includes the crossover 85. The crossover 85 is a two layered metallization structure. The top layer of metallization is shown in section and thus cross-hatched. The lower layer is positioned beneath the cross hatched layer and is shown in dashed since it is otherwise obscured by not only the upper layer but also whatever interlevel dielectric material is positioned in and around the conductors that is not otherwise shown in FIG. 4. To the left of the crossover 85, plural wires 110, 115, 120, 125, 130, 135, 140 and 145 of the clock pathway DCLK$_0$ convey clock phases CLK 0°, CLK 45°, CLK 90°, CLK 135°, CLK 180°, CLK 225°, CLK 270° and CLK315°, respectively. The clock phases CLK 0°, CLK 45°, CLK 90°, CLK 135°, CLK 180°, CLK 225°, CLK 270° and CLK 315° are in order going into the crossover. The wire 110 terminates at a conductive via 150, which drops down to the next level and connects electrically to a crossover conductor 155. The crossover conductor 155 passes from at or nearer the edge 107, underneath the wires 110, 115, 120, 125, 130, 135, 140 and 145 and connects to a conductive via 160, which projects upward to electrically connect to a wire 165 that is nearer or at the edge 106. Thus, the clock phase CLK 0° phase proceeds from the wire 110 to the conductive via 150 down to the crossover wire 155 up the conductive via 160 and then left to right on the wire 165 with a progressive zig-zagging laterally and generally downward (along the y-axis). In this way, the clock phase CLK 0° rotates from a position on or nearer the outside region 109 (i.e., nearer the side 107) of the clock pathway DCLK$_0$ to a position nearer the midline 108 thereof. The wire 115 proceeds slightly further along the x-axis than the wire 110 but similarly terminates at a conductive via 170, which drops down and connects to a crossover wire 175 routed beneath the wires 120, 125, 130, 135, 140 and 145. The crossover wire 175 connects to a conductive via 180 which projects upward and connects to a wire 185. Thus, the clock phase CLK 45° signal travels from the wire 115 to the conductive via 170 down to the crossover wire 175 up the conductive via 180 and parallel along the x-axis on the wire 185 with a progressive zig-zagging laterally and generally downward (along the y-axis). In this way, the clock phase CLK 45° is rotated from a position on nearer the outside 109 (i.e., the edge 107) of the clock pathway DCLK$_0$ to a position nearer the midline 108 thereof. The wire 120 proceeds farther along the x-axis than the wires 110 and 115 and terminates at a conductive via 190, which drops down and makes a connection with a crossover wire 195 routed underneath and transverse to the wires 125, 130, 135, 140 and 145. The crossover wire 195 connects to a conductive via 200, which projects upward to connect to a wire 205. In this way, the clock phase CLK 90° is rotated from a position nearer the midline 108 of the clock pathway DCLK$_0$ to a position nearer the outside region 109. Finally, the wire 125 terminates to the right along the x-axis beyond the wires 110, 115 and 120 and connects to a conductive via 210, which drops down to a crossover wire 215. The crossover wire 215 spans beneath and transverse to the wires 125, 130, 135, 140 and 145 and connects to a conductive via 220 which projects upward and connects to a wire 225. In this way, the clock phase CLK 135° is rotated from a position nearer the midline 108 of the clock pathway DCLK$_0$ to a position nearer the outside region 109. To the left of the crossover 85, the wires 130, 135, 140 and 145 do not utilize conductive vias or crossovers. However, because of their respective zig-zagging lateral and generally downward (along the y-axis) routing the positions where the clock phases CLK 180°, CLK 225°, CLK 270° and CLK 315° are conveyed are flip-flopped from their positions before and after the crossover 85. This rotation of wires and thus rotation of the position where particular clock phase signals are conveyed along the length of the segment shown in FIGS. 3 and 4 essentially balances the capacitive loading associated with the multiple clock phases CLK 0°, CLK 45°, CLK 90°, CLK 135°, CLK 180°, CLK 225°, CLK 270° and CLK 315°. Note that capacitive coupling, and thus power consumption, is reduced if the clock phases CLK 0°, CLK 45°, CLK 90°, CLK 135°, CLK 180°, CLK 225°, CLK 270° and CLK 315° remain in cyclical order before and after a crossover, such as the crossover 85 or the crossover 90. Cyclical order is maintained where the phase difference Δφ between adjacent wires is maintained at 360°/N, where N is the number of phases. As shown in FIG. 4, and for this example where N=8, the phase difference between adjacent wires is 360°/8 or 45° before and after the crossover 85.

Figure 5:
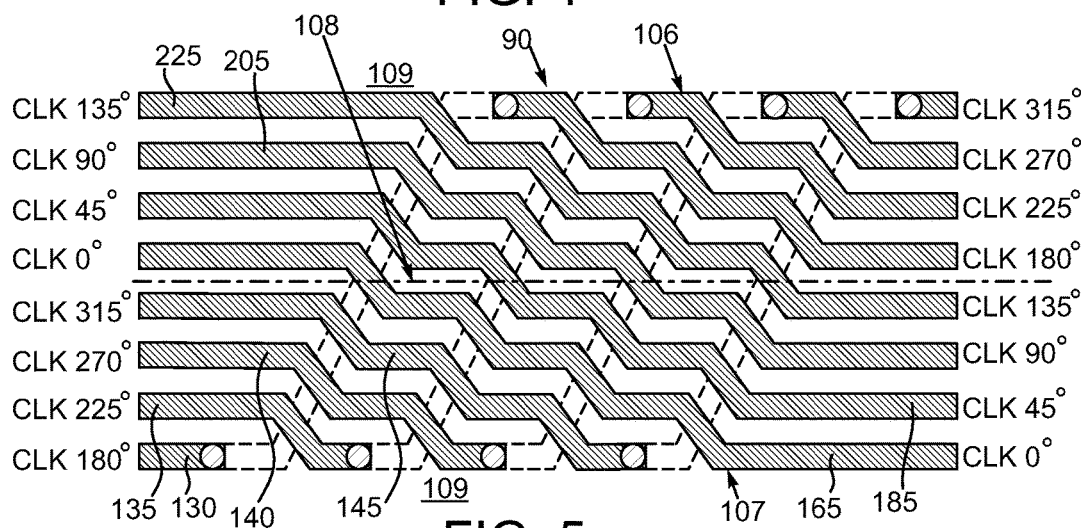
FIG. 5 is a sectional view of an exemplary arrangement of another of the crossovers of FIG. 3.

Attention is now turned to FIG. 5, which is a sectional like FIG. 4, but shows the next crossover 90. The left hand side of the cross over 90 shows the particular physical locations of the wires 130, 135, 140, 145, 165, 195, 205 and 225 and their associated clock phases CLK 0°, CLK 45°, CLK 9°, CLK 135°, CLK 180°, CLK 225°, CLK 270° and CLK3 15°. Note that the positions of the clock phases CLK 0°, CLK 45°, CLK 90°, CLK 135°, CLK 180°, CLK 225°, CLK 270° and CLK 315° at the input of the crossover 90 and the output of the crossover 85 by definition are the same. Note also that going out of the crossover 90, the positions of the clock phases CLK 0°, CLK 45°, CLK 9°, CLK 135°, CLK 180°, CLK 225°, CLK 270° and CLK 315° rotate back to the same positions at the input to the crossover 85, i.e., go back into order. These continuous cross overs 85, 90, 95, 100 and 105 are designed to keep a given clock lane, such as clock 0°, at or nearer the midline 108 of the clock path DCLK$_0$ and at or nearer the outside 109 region (nearer the edge 106 or the edge 107) for about the same physical distance along the clock pathway DCLK$_0$. Again cyclical order is maintained where the phase difference Δφ between adjacent wires is maintained at 360/N.

In the arrangement depicted in FIGS. 4 and 5, a given crossover, such as the crossover 85, involves four wires changing position. However, the skilled artisan will appreciate that a crossover can include changing the position of a single wire, two wires, three wires or other numbers, along the clock pathway DCLK$_0$ all with the goal of load balancing just described in conjunction with four-wire crossovers 85, 90, etc.

Figure 6:
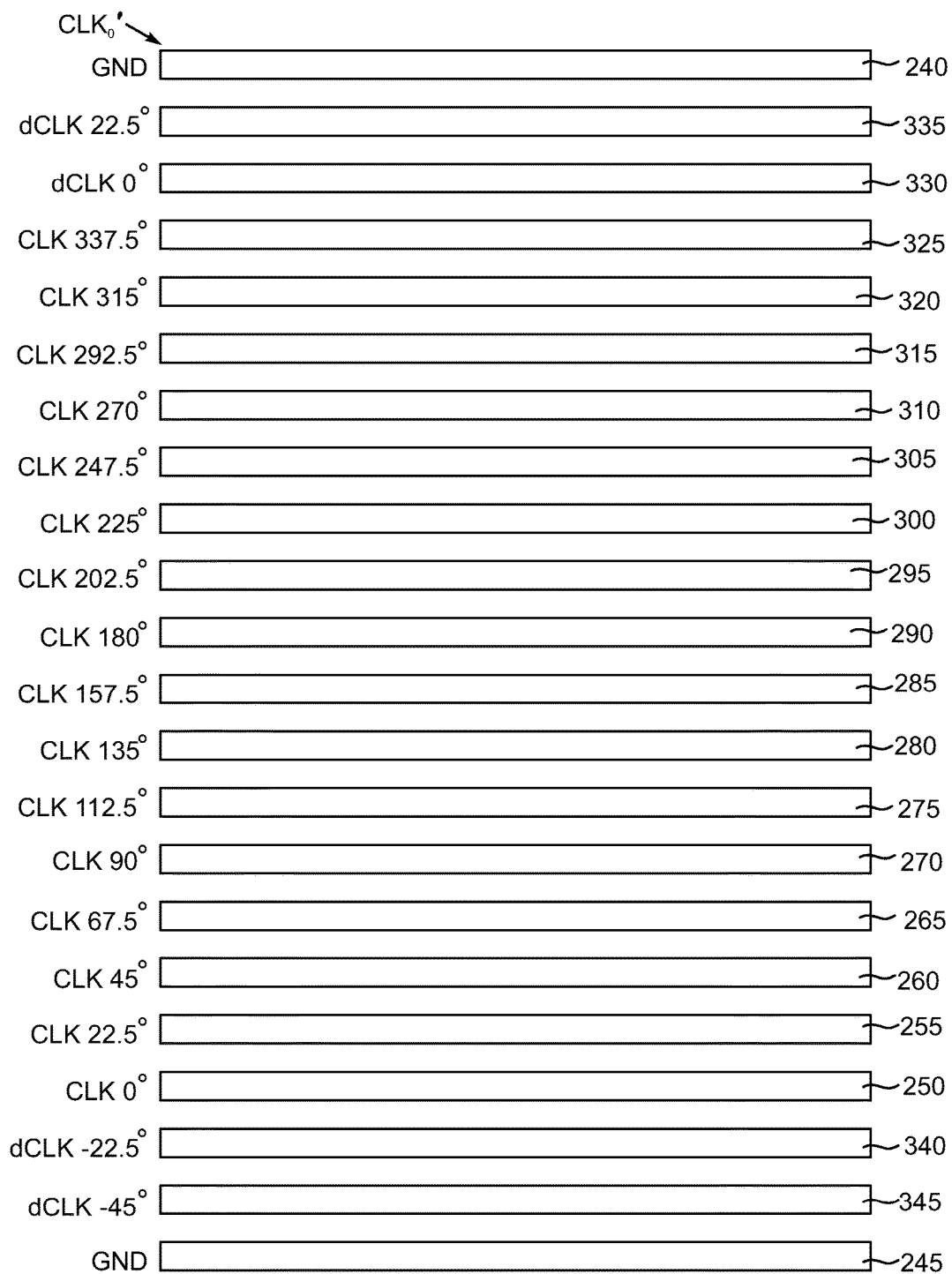
FIG. 6 is a block diagram of another exemplary arrangement of a multi-phase clock pathway with capacitive load balancing.

Another exemplary arrangement for balancing capacitive loading for multi-phase clock signals may be understood by referring now to FIG. 6, which is a schematic representing a small segment of an alternate exemplary clock pathway CLK$_0$'. In this exemplary arrangement CLK$_0$' is a sixteen phase clock pathway that is guarded laterally on either side by ground wires 240 and 245 respectively. The clock pathway CLK$_0$' consists of plural and in this case sixteen operational wires 250, 255, 260, 265, 270, 275, 280, 285, 290, 295, 300, 305, 310, 315, 320 and 325 and four dummy clock wires 330, 335, 340 and 345 bracketing the operational wires 250, 255, 260, 265, 270, 275, 280, 285, 290, 295, 300, 305, 310, 315, 320 and 325. Note that the dummy wires 330 and 335 are positioned on one side of the operational wires 250, 255, 260, 265, 270, 275, 280, 285, 290, 295, 300, 305, 310, 315, 320 and 325 and the wires 340 and 345 are positioned on the opposite side of the wires 250, 255, 260, 265, 270, 275, 280, 285, 290, 295, 300, 305, 310, 315, 320 and 325. The wires 250, 255, 260, 265, 270, 275, 280, 285, 290, 295, 300, 305, 310, 315, 320 and 325 convey clock phases according to the table shown below.

TABLE

| Wire Number | Wire Type | Clock Phase φ (degrees) |
|---|---|---|
| 240 | ground | n/a |
| 245 | ground | n/a |
| 250 | clock | 0 |
| 255 | clock | 22.5 |
| 260 | clock | 45 |
| 265 | clock | 67.5 |
| 270 | clock | 90 |
| 275 | clock | 112.5 |
| 280 | clock | 135 |
| 285 | clock | 157.5 |
| 290 | clock | 180 |
| 295 | clock | 202.5 |
| 300 | clock | 225 |
| 305 | clock | 247.5 |
| 310 | clock | 270 |
| 315 | clock | 292.5 |
| 320 | clock | 315 |
| 325 | clock | 337.5 |
| 330 | dummy clock | 0 |
| 335 | dummy clock | 22.5 |
| 340 | dummy clock | −22.5 |
| 345 | dummy clock | −45 |

The dummy clock signals on the dummy wires 330, 335, 340 and 345 are used for load balancing but not clocking purposes on the receiver side. Note that the wires 330 and 335 convey dummy clock phases dCLK 0° and dCLK 22.5° and the wires 340 and 345 convey dummy clock phases dCLK −22.5° and dCLK −45.° It should be understood that additional dummy phases could be used in addition to those on the wires 330, 335, 340 and 345. A technical objective associated with the arrangement depicted in FIG. 6 is to attempt to have all of the operational phases or wires 250, 255, 260, 265, 270, 275, 280, 285, 290, 295, 300, 305, 310, 315, 320 and 325 see approximately the same capacitive loading. Since capacitive loading $C_L$ related to the phase difference $\Delta\varphi$ between adjacent clock phases according to $C_L \propto \Delta\varphi$, dummy phase selection is utilized to keep $\Delta\varphi$ between adjacent clock phases as small as possible. For example, the phase of wire 325 is 337.5°. Accordingly, the phase for the adjacent dummy wire 330 is selected to be something close to 337.5 to keep the phase change $\Delta\varphi$, that is, 0°-337.5° relatively small, e.g., $\Delta\varphi$=22.5. The same is true with regard to the next adjacent dummy clock wire 335, which is at 22.5°. In other words, it might be undesirable to have the wire 330 convey a dummy clock signal of 180°, for example, as opposed to 0°. The same is true with regard to the selection of phase for the dummy wire 340 and dummy wire 345. In this arrangement, the dummy clock signal dCLK −22.5° for the wire 340 is selected to be something relatively close to the phase (0°) on wire 250 such as −22.5° and so forth for dCLK −45° and the dummy wire 345. It should be understood that it can be possible to use other than the particular phase angles depicted in FIG. 6 and the table just described and that perhaps even different angle spacings or different combinations could be used as well.

It should be understood that there can be more or less than sixteen clock lanes. Furthermore, the semiconductor chip 15 can, via the Communications Code 25 shown in FIG. 1 or otherwise, selectively enable or disable some or all of the dummy clock wires 330, 335, 340 and 345. For example, where the chip 15 senses a need for less power savings due to loading issues or a drop in signal frequencies, then dummy wires 335 and 345 could be temporarily disabled. If conditions call for more load balancing then the dummy wires 335 and 345 could be reenabled. This sensing could be instantaneous or periodic.

Figure 2:
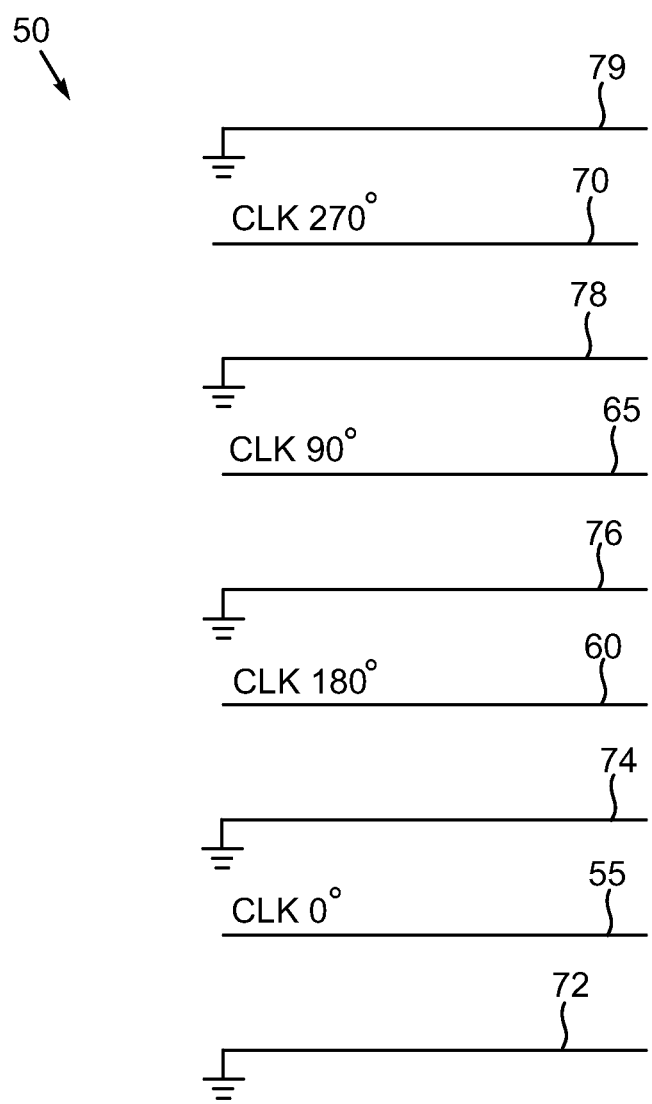
FIG. 2 is a schematic depiction of an exemplary conventional multi-phase clock pathway.

It will be useful to briefly compare the capacitive loading of the conventional clock pathway arrangement 50 (i.e., ground-clock-ground) shown in FIG. 2 and the load balanced arrangement in FIG. 6 for example. For this comparison, consider the capacitive loading of a signal with two close neighbors in the same metal layer. It is assumed that the clock signals are sinusoidal and that conventional and new arrangements use the same metal width and spacing. The capacitively coupled current $i_{coupled}$ is given by:

$$i_{coupled} = C\frac{dv}{dt} \quad (1)$$

where C is the capacitive coupling per unit length of transmission line and v is the line voltage. Let the line voltage v be defined as:

$$v = a_0 \sin(\omega t) \quad (2)$$

where $a_0$ is some constant. The current coupling to the left of the clock wire (i.e., to one neighboring wire) is $i_{coupledleft}$ and to the right of the clock wire (to the opposite neighboring wire) is $i_{coupledright}$. The voltage differences between the clock wire and the neighboring wires are $v_1$ and $v_2$, respectively. For the conventional clock pathway 50 the current coupling $i_{coupledleft}$ and $i_{coupledright}$ can be expressed using Equation (1) and Equation (2) as follows:

$$i_{coupledleft} = i_{coupledright} = C\frac{dv}{dt} = C(\omega a_0 \cos(\omega t)) \quad (3)$$

For the new adjacent phases arrangement $CLK_0'$ in FIG. 6, the current coupling can be expressed using Equations (1) and Equation (2) as follows:

$$\frac{dv_1}{dt} = \left(a_0 \cos \omega t - a_0 \cos\left(\omega t + \frac{2\pi}{N}\right)\right) \quad (4)$$

where N is the number of clock phases (16 in this example). By converting the $\cos(\omega t)$ term to the phasor domain, Equation (4) simplifies to:

$$\frac{dv_1}{dt} = -2a_0 \sin\left(\frac{\pi}{N}\right)\sin\left(\omega t + \frac{\pi}{N}\right) \quad (5)$$

So the coupling current is reduced by $2\sin(\pi/N)$. For N=16, the reduction is 0.390X where X is conventional coupling current. For N=8 the reduction would be 0.765X. The number of wires needed to convey distributed clock signals is reduced, which frees up chip area for various purposes. The extra chip area could be used to increase the spacing of clock wires, which will produce an attendant decrease in power consumption.

The components of the semiconductor chip 15 disclosed herein can be fabricated using well-known semiconductor manufacturing materials, such as doped polysilicon, metals, such as copper, gold, platinum or other conductor materials, and well-known techniques, such as plating, chemical vapor deposition, ion implantation, etching, photolithography, annealing, sputtering or the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip having a receiver, comprising:
   a clock signals pathway for conveying plural clock phases in the receiver, the clock signals pathway including plural wires in an arrangement having a first edge, a second edge separated from the first edge and a midline between the first edge and the second edge, each of the wires conveying a clock phase; and
   the wires of the arrangement being routed so that, along a length of the clock signals pathway, each of the wires spends about the same percentage of time at or nearer the first edge or the second edge and at or nearer the midline.

2. The semiconductor chip of claim 1, wherein the arrangement includes a first crossover to rotate one of the wires from a first position nearer the first edge or the second edge to a second position nearer the midline and rotate another of the wires from a third position nearer the midline to a fourth position nearer the first edge or the second edge, and a second crossover longitudinally separated from the first crossover to rotate the one of the wires from the second position nearer the midline to the first position nearer the first edge or the second edge and rotate the another of the wires from the fourth position nearer the midline to the third position nearer the first edge or the second edge.

3. The semiconductor chip of claim 2, wherein the wires comprise two conductor layers, a first of the conductor layers having the one of the wires and the second of the conductor layers having a first crossover wire connecting the one of the wires to another wire in the first conductor layer.

4. The semiconductor chip of claim 3, wherein the second conductor layer not including a crossover wire connects the another of the wires to another wire in the first conductor layer.

5. The semiconductor chip of claim 3, comprising plural conductive vias connecting the first crossover wire to the first conductor layer.

6. The semiconductor chip of claim 2, wherein the clock phases are in cyclical order going into and out of the first and second crossovers.

7. The semiconductor chip of claim 1, wherein the receiver is configured to receive data signals from a transmitter and configured to use one or a combination of the clock phases to adjust phase of the data signals.

8. A semiconductor chip having a receiver, comprising:
   a clock signals pathway for conveying plural clock phases and plural dummy clock phases in the receiver, the clock signals pathway including plural wires in an arrangement having a first side and a second side, each of the wires conveying a clock phase or a dummy clock phase;
   a first group of the wires carrying the plural clock phases in order;
   a second group of the wires carrying the plural dummy clock phases, the second group of wires bracketing the first group of wires; and
   first and second ground wires bracketing the plural wires.

9. The semiconductor chip of claim 8, wherein one or more of the wires conveying dummy clock phases can be selectively enabled or disabled.

10. The semiconductor chip of claim 8, wherein a last wire in the first group proximate the first side has a first phase, the wires of the second group positioned proximate the last wire in the first group having phase differences relative to the first phase that increase with increasing distance from the last wire of the first group, and wherein a last wire in the first group proximate the second side has a second phase, the wires of the second group positioned proximate the last wire in the first group having phase differences relative to the second phase that increase with increasing distance from the last wire of the first group proximate the second side.

11. A method of manufacturing a semiconductor chip having a receiver, comprising:
    fabricating a clock signals pathway for conveying plural clock phases in the receiver, the clock signals pathway including plural wires in an arrangement having a first edge, a second edge separated from the first edge and a midline between the first edge and the second edge, each of the wires conveying a clock phase; and
    routing the wires of the arrangement so that, along a length of the clock signals pathway, each of the wires spends about the same percentage of time at or nearer the first edge or the second edge and at or nearer the midline.

12. The method of claim 11, wherein the arrangement includes a first crossover to rotate one of the wires from a first position nearer the first edge or the second edge to a second position nearer the midline and rotate another of the wires from a third position nearer the midline to a fourth position nearer the first edge or the second edge, and a second crossover longitudinally separated from the first crossover to rotate the one of the wires from the second position nearer the midline to the first position nearer the first edge or the second edge and rotate the another of the wires from the fourth position nearer the midline to the third position nearer the first edge or the second edge.

13. The method of claim 12, wherein the wires comprise two conductor layers, a first of the conductor layers having the one of the wires and the second of the conductor layers having a first crossover wire connecting the one of the wires to another wire in the first conductor layer.

14. The method of claim 13, wherein the second conductor layer not including a crossover wire connects the another of the wires to another wire in the first conductor layer.

15. The method of claim 14, comprising fabricating plural conductive vias connecting the first crossover wire to the first conductor layer.

16. The method of claim 12, wherein the clock phases are in cyclical order going into and out of the first and second crossovers.

17. The method of claim 11, wherein the receiver is configured to receive data signals from a transmitter and configured to use one or combined multiple of the clock phases to adjust phase of the data signals.

18. A method of manufacturing a semiconductor chip having a receiver, comprising:
    fabricating a clock signals pathway for conveying plural clock phases and plural dummy clock phases in the receiver, the clock signals pathway including plural wires in an arrangement having a first side and a second side, each of the wires conveying a clock phase or a dummy clock phase;

a first group of the wires carrying the plural clock phases in order;

a second group of the wires carrying the plural dummy clock phases, the second group of wires bracketing the first group of wires; and fabricating first and second ground wires bracketing the plural wires.

19. The method of claim 18, wherein one or more of the wires conveying dummy clock phases can be selectively enabled or disabled.

20. The method of claim 18, wherein a last wire in the first group proximate the first side has a first phase, the wires of the second group positioned proximate the last wire in the first group having phase differences relative to the first phase that increase with increasing distance from the last wire of the first group, and wherein a last wire in the first group proximate the second side has a second phase, the wires of the second group positioned proximate the last wire in the first group having phase differences relative to the second phase that increase with increasing distance from the last wire of the first group proximate the second side.

* * * * *